US007705373B2

(12) United States Patent
Koizumi et al.

(10) Patent No.: US 7,705,373 B2
(45) Date of Patent: Apr. 27, 2010

(54) SOLID STATE IMAGE PICKUP DEVICE AND MANUFACTURING METHOD THEREFOR

(75) Inventors: Toru Koizumi, Yokohama (JP); Shigetoshi Sugawa, Atsugi (JP); Isamu Ueno, Hadano (JP); Tesunobu Kochi, Hiratsuka (JP); Katsuhito Sakurai, Machida (JP); Hiroki Hiyama, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 255 days.

(21) Appl. No.: 11/773,731

(22) Filed: Jul. 5, 2007

(65) Prior Publication Data
US 2007/0257281 A1    Nov. 8, 2007

Related U.S. Application Data

(62) Division of application No. 10/622,540, filed on Jul. 21, 2003, now Pat. No. 7,274,394, which is a division of application No. 09/271,887, filed on Mar. 18, 1999, now Pat. No. 6,661,459.

(30) Foreign Application Priority Data
Mar. 19, 1998   (JP)   ................... 10-070537

(51) Int. Cl.
*H01L 29/76*   (2006.01)

(52) U.S. Cl. ................. 257/222; 257/225; 257/233; 257/292; 257/E31.099

(58) Field of Classification Search ................. 257/222, 257/225, 233
See application file for complete search history.

(56) References Cited

U.S. PATENT DOCUMENTS 4,862,242 A    8/1989   Wildi et al. ............. 357/48

(Continued)

FOREIGN PATENT DOCUMENTS

| EP | 0 738 010 | 10/1996 |
|---|---|---|
| EP | 0 809 299 | 11/1997 |
| JP | 59-198756 | 11/1984 |
| JP | 64-014958 | 1/1989 |
| JP | 8-335690 | 12/1996 |

OTHER PUBLICATIONS

European Search Report, issued by the European Patent Office on Aug. 12, 2005, in European Patent Appln. No. 99302095.7.

(Continued)

*Primary Examiner*—Eugene Lee
(74) *Attorney, Agent, or Firm*—Fitzpatrick, Cella, Harper & Scinto

(57) ABSTRACT

A MOS-type solid-state image pickup device includes a photoelectric conversion unit having a first semiconductor region of a first conductivity type, a second semiconductor region of a second conductivity type forming a pn-junction with the first semiconductor region, a third semiconductor region of the first conductivity type disposed at a light incident side of the second semiconductor region, and a transfer MOS transistor having the second semiconductor region, a fourth semiconductor region of the second conductivity type, and a gate electrode disposed on an insulating film on the first semiconductor region between the photoelectric conversion unit and the fourth semiconductor region to transfer a charge carrier from the second semiconductor region to the fourth semiconductor region. The photoelectric conversion unit and the transfer MOS transistor are disposed on a substrate. A fifth semiconductor region of the second conductivity type is arranged continuously to the second semiconductor region under the gate electrode, and a sixth semiconductor region of the second conductivity type having an impurity concentration lower than that of the fourth semiconductor region is arranged at a side of the gate electrode in the fourth semiconductor region. A drain of the transfer MOS transistor includes the fourth and sixth semiconductor regions, and a bias is applied to the drain, and the fifth semiconductor region is depleted during reading out the charge carrier from the second semiconductor region.

6 Claims, 8 Drawing Sheets

U.S. PATENT DOCUMENTS

| | | | | |
|---|---|---|---|---|
| 4,974,043 A | * | 11/1990 | Stevens | 257/234 |
| 5,017,985 A | | 5/1991 | Lin | 357/23.13 |
| 5,245,201 A | | 9/1993 | Kozuka et al. | 257/53 |
| 5,378,641 A | | 1/1995 | Cheffings | 438/302 |
| 5,514,887 A | * | 5/1996 | Hokari | 257/222 |
| 5,625,210 A | | 4/1997 | Lee et al. | 257/292 |
| 5,675,158 A | | 10/1997 | Lee | 257/233 |
| 5,872,371 A | | 2/1999 | Guidash et al. | 257/230 |
| 5,880,495 A | | 3/1999 | Chen | 257/233 |
| 5,881,184 A | | 3/1999 | Guidash | 382/321 |
| 5,892,253 A | | 4/1999 | Merrill | 257/292 |
| 6,023,081 A | | 2/2000 | Drowley et al. | 257/290 |
| 6,107,655 A | | 8/2000 | Guidash | 257/233 |
| 6,331,873 B1 | | 12/2001 | Burke et al. | 348/314 |
| 6,528,376 B1 | | 3/2003 | Guo | 438/302 |

OTHER PUBLICATIONS

Lee, et al., "An Active Pixel Sensor... Technology", IEEE Workshop, 1995.

* cited by examiner

ONE PIXEL

EQUIPOTENTIAL LINE

SOLID STATE IMAGE PICKUP DEVICE AND MANUFACTURING METHOD THEREFOR

This is a divisional of application Ser. No. 10/622,540, filed on Jul. 21, 2003, which is a divisional of application Ser. No. 09/271,887, now U.S. Pat. No. 6,661,459.

BACKGROUND OF THE INVENTION

1. Field of the Invention

The present invention relates to a solid state image pickup device and a method for manufacturing the same.

2. Related Background Art

As the representative structures of the solid state image pickup device, there are known a CCD sensor consisting of photodiodes and CCD shift registers, and a CMOS sensor such as APS (active pixel sensor) consisting of photodiodes and MOS transistors.

The APS is provided, in each pixel, with a photodiode, an MOS switch, an amplifier circuit for amplifying the signal from the photodiode etc., and has various advantages of enabling XY addressing and single-chip integration of the sensor and the signal processing circuit. On the other hand, because of a larger number of elements in each pixel, the APS is associated with a smaller pixel aperture rate and difficulty in reducing the chip size which determines the dimension of the optical system, and, for these reasons, the majority of the commercially available solid state image pickup devices is represented by the CCD.

However, the CMOS sensor is recently attracting attention, because of the progress in the technology for size reduction of the MOS transistors and the increasing demand for the single-chip integration of the sensor and the signal processing circuit and for the lower electric power consumption.

FIG. 1 is an equivalent circuit diagram of a pixel region of the conventional APS and a solid state image pickup device utilizing the same, as reported by Eric R. Fossum et al. at the 1995 IEEE Work Shop. In the following there will be briefly explained the configuration of the prior technology.

The photoelectric conversion unit is composed of a buried photodiode of the type employed in the CCD. The buried photodiode with a surfacially highly doped p-layer can suppress the dark current generated at the $SiO_2$ surface, and there can also be formed a junction capacitance between the n-layer in the accumulation unit and the surfacial p-layer, thereby increasing the saturation charge amount of the photodiode.

A photo-induced signal charge $Q_{sig}$ accumulated in a photoelectric conversion unit (photodiode) PPD is transferred, through a transfer unit TX consisting of a MOS transistor, to a floating diffusion region FD.

The signal charge $Q_{sig}$ is converted by the capacitance $C_{FD}$ of the floating diffusion region into a voltage $Q_{sig}/C_{FD}$, which is read through a source follower circuit.

In such prior technology, however, since the n-layer constituting the charge accumulation region is separated from the surface, it is necessary, in order to read the charge from such charge accumulation region to the floating diffusion region, to apply a voltage higher than in the ordinary MOS transistor to the control electrode of the MOS transistor employed in the transfer unit (transferring MOS transistor).

FIG. 5 shows the potentials of the channel region in a conventional MOS transistor and the transferring MOS transistor. In FIG. 5, the light enters from the left-hand side, and, on the right-hand side there are formed in succession a transparent insulation layer such as of $SiO_2$ or SiN, a highly doped p-layer and an n-layer constituting the photodiode. The curve shows changes in the potential level under the voltage application. In FIG. 5, there are shown an oxide layer 301, Fermi level 302 of the n-layer of the photodiode, Fermi level 303 of a bypass region, a potential 304 under the application of a threshold voltage of the present invention, and a potential 305 under the application of the threshold voltage of the prior technology.

As indicated by a broken line in FIG. 5., the potential has to be varied larger since the n-layer is separated from the surface.

The threshold voltage $V_{th}$ of the conventional MOS transistor is given by the following equation:

$$V_{th} = \frac{\sqrt{2\phi_F + V_S) * 2\varepsilon_{Si} * qN_{sub}}}{C_{OX}} + 2\phi_F + V_S + V_{FB}$$

wherein:

$\phi$: Fermi potential
$V_s$: substrate bias
$\varepsilon_{si}$: dielectric constant of Si
q: charge amount of electron
$N_{sub}$: substrate impurity concentration
$V_{FB}$: flat band voltage
$C_{OX}$: parasite capacitance of floating diffusion region.

On the other hand, the threshold voltage $V_{th}$ of the transfer MOS transistor for transfer from the buried photodiode is given by the following equation, wherein $X_j$ is the junction depth of the surfacial p-layer of the photodiode:

$$V_{th} = \frac{\sqrt{(2\phi_F + V_S) * 2\varepsilon_{Si} * qN_{sub}}}{C_{OX}} * A + (2\phi_F + V_S) * A^2 + V_{FB}$$

$$A = 1 + \frac{X_j}{\sqrt{\frac{(2\phi_F + V_S) * 2\varepsilon_{Si}}{qN_{sub}}}}$$

Since the difference of the two becomes larger as the impurity concentration in the substrate becomes higher, the charge reading becomes more difficult with the increase in the impurity concentration of the substrate in case of a finer geometry of the elements.

More specifically, under the conditions of an oxide layer thickness of 15 nm and an impurity concentration of $8 \times 10^{16}$ $cm^{-3}$ in the p-type well, the threshold voltage of the ordinary MOS transistor is about 0.7 V while that of the buried source becomes as high as 5.0 V. In the prior art, it becomes impossible to read almost all the change from the photodiode with the increase in the threshold voltage. As a result, the charge remains in the photodiode, thus forming a retentive image or a noise, thus significantly deteriorating the image quality.

SUMMARY OF THE INVENTION

The object of the present invention is to provide a solid state image pickup device capable of efficiently transferring the charge accumulated in the photoelectric conversion element, and a manufacturing method therefor.

In order to attain the above-mentioned object, according to an aspect of the present invention, there is provided a solid state image pickup device comprising a photoelectric conversion unit including a first region of a first conductive type formed on a semiconductor substrate having a main surface, a second region of a second conductive type formed in the first region, and a third region of the first conductive type formed between the second region and the main surface; a fourth region of the second conductive type formed in the first region; and a charge transfer unit including the first region, an insulation layer on the first region and a control electrode on the insulating layer, for transferring a signal charge accumulated in the photoelectric conversion unit to the fourth region; wherein the photoelectric conversion unit and the charge transfer unit are connected through a fifth region of the second conductive type.

Also according to the present invention, there is provided a method for forming a solid state image pickup device including at least (1) a photoelectric conversion unit including a first region of a first conductive type formed on a semiconductor substrate having a main surface, a second region of a second conductive type formed in the first region, and a third region of the first conductive type formed between the second region and the main surface, (2) a fourth region of the second conductive type formed in the first region, (3) a charge transfer unit including the first region, an insulation layer on the first region and a control electrode on the insulation layer, for transferring the signal charge accumulated in the photoelectric conversion unit to the fourth region, wherein the method comprising an ion implantation step of doping an impurity for forming the second conductive type into the second region, utilizing the control electrode of the charge transfer unit as a mask.

According to another aspect of the present invention, there is provided a method for forming a solid state image pickup device comprising a photoelectric conversion unit including a first region of a first conductive type formed on a semiconductor substrate having a main surface, a second region of a second conductive type formed in the first region, and a third region of the first conductive type formed between the second region and the main surface; a fourth region of the second conductive type formed in the first region; and a charge transfer unit including the first region, an insulation layer on the first region and a control electrode on the insulation layer, for transferring the signal charge accumulated in the photoelectric conversion unit to the fourth region, wherein a fifth region of the second conductive type is formed between the photoelectric conversion unit and the charge transfer unit.

Other objects of the present invention, and the features thereof, will become fully apparent from the following description, which is to be taken in conjunction with the attached drawings.

DESCRIPTION OF THE PREFERRED EMBODIMENTS

In the following there will be explained a first embodiment of the present invention. Referring to the configuration shown in FIG. 3, there is provided, between the photodiode and the transfer MOS transistor, a region of a conductive type same as that of the charge accumulation layer. For example, in case of a photodiode consisting of a charge accumulation region formed in a p-well and a surfacially highly doped p-layer formed on the surface of the charge accumulation region, there is provided an n-doped region. Such the region is hereinafter called a bypass region. As a result of providing the bypass region, the electrons in the charge accumulation region move to the floating diffusion region through the bypass region of the low potential and the surface of the transfer MOS transistor, whereby the threshold voltage thereof can be made lower than in the prior art.

Figure 1:
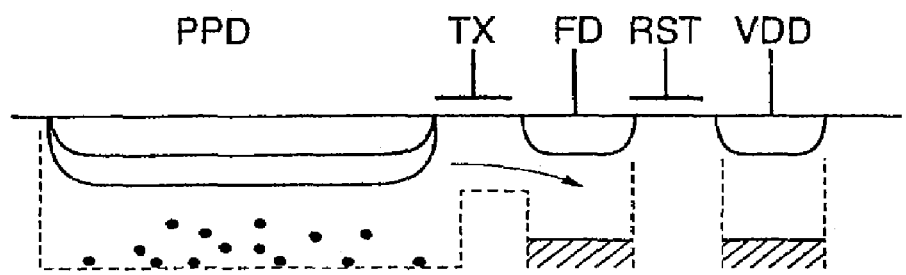
FIG. 1 is a schematic cross-sectional view of a prior art.
Figure 2A:
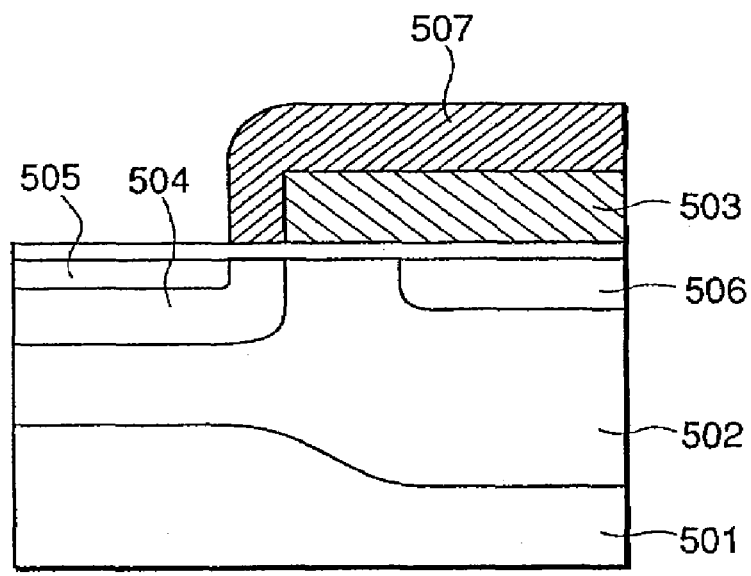
FIGS. 2A and 2B are cross-sectional views of a CCD provided with a bypass region.
Figure 2B:
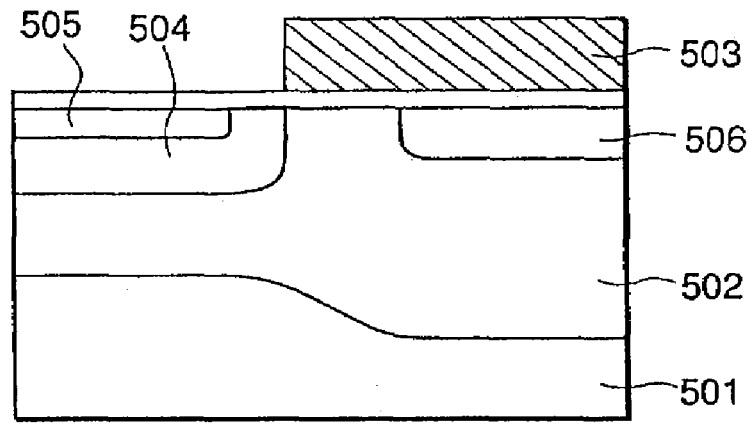

However, the concept of such bypass region is already adopted in the image pickup device employing the CCD shift register, and a configuration shown in FIG. 2B was reported in the Television Association Technical Report Vol. 13, No. 11 (1989). The bypass region consisting of a surfacially highly doped p-layer 505 is prepared for example by forming a resist layer 507 as shown in FIG. 2A. In FIGS. 2A and 2B, there are shown an n-type substrate 501, a p-well 502, a CCD vertical transfer electrode 503, an n-layer 504 constituting the photodiode, and a CCD vertical register 506.

The bypass region is required to meet the following conditions:

(1) A certain impurity concentration and a certain width are required for the function as the bypass region; and (2) The bypass region has to be depleted for all the reading conditions, in order to achieve depleted transfer.

Thus the conditions (1) and (2) respectively determine the lower limit and the upper limit of the impurity concentration and the width of the bypass region. If the impurity concentration of the substrate increases as a result of pixel size reduction, the margin of the impurity concentration and the width of the bypass region is inevitably reduced.

Also in case of employing the CCD shift register, there result following limitations:

(1) the n-channel region of the vertical CCD shift register, corresponding to the drain region of the transfer MOS transistor, has to have a low impurity concentration, and (2) the difference between the gate voltage of the transfer MOS transistor and the voltage of the drain region thereof (channel region of the vertical CCD shift register) is almost as small as the build-in potential resulting from the difference in the impurity concentration.

Consequently, in the image pickup device employing the CCD shift register, the lines of electric force from the drain region of the transfer MOS transistor do not have any influence on the photodiode.

On the other hand, the configuration of the present embodiment has the following features:

(1) the drain region of the transfer MOS transistor comprising a highly doped n-region, constituting the floating diffusion region; and (2) the drain voltage being controllable independently from the gate voltage.

As a result, in the present embodiment, the lines of electric force from the drain region can be made to influence the photodiode, thereby assisting the extraction of electrons from the charge accumulation layer.

Figure 4:
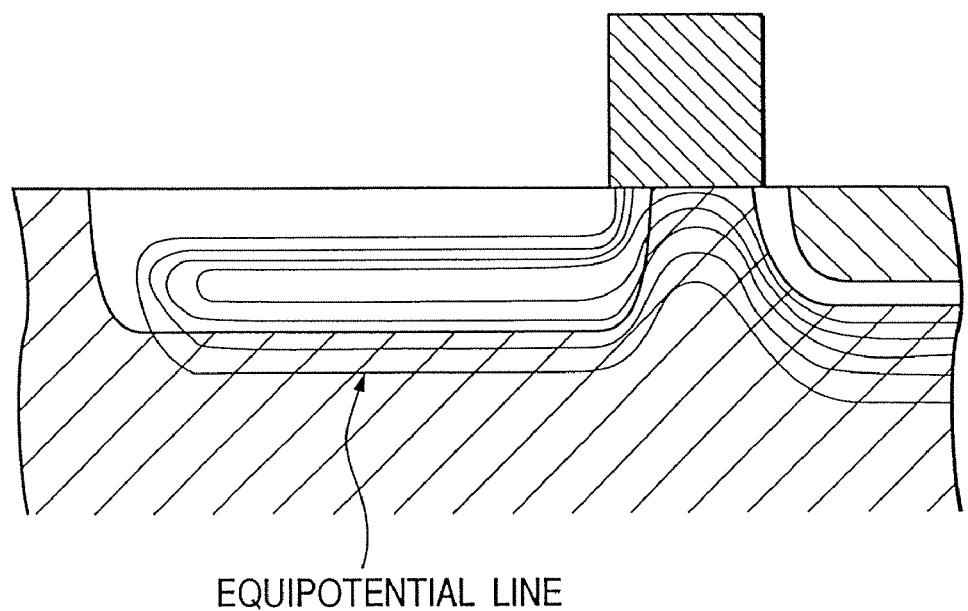
FIG. 4 is a planar potential chart of the embodiment of the present invention shown in FIG. 3.
Figure 5:
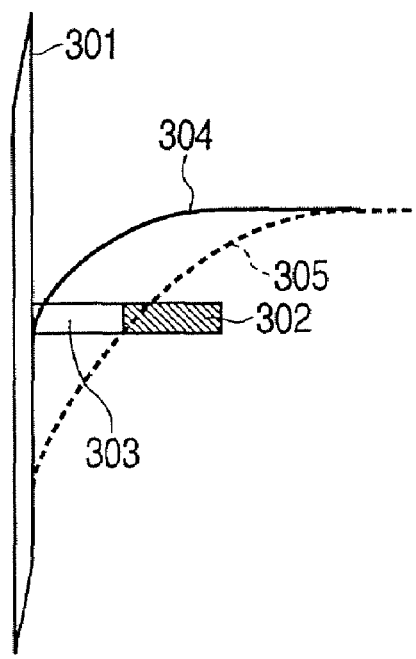
FIG. 5 is a cross-sectional potential chart of the embodiment of the present invention shown in FIG. 3.

Therefore, the aforementioned margin of the impurity concentration and the width of the bypass region can be made wider in comparison with that in the prior art. The potential state of the present embodiment is shown in FIG. 4.

Figure 3:
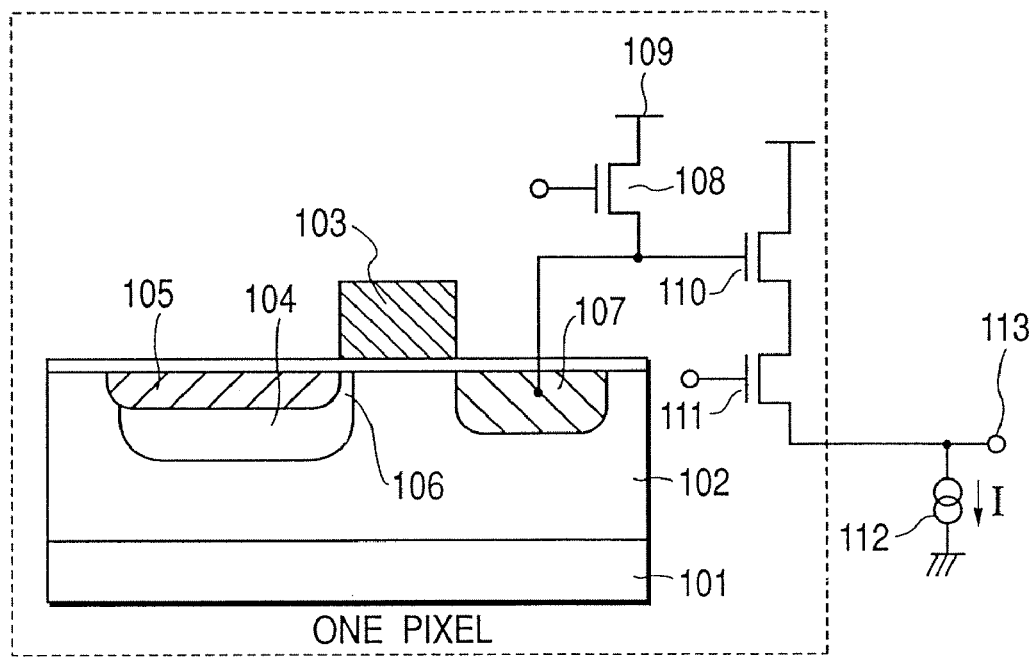
FIG. 3 is a cross-sectional view of an embodiment of the present invention.

In FIG. 3, the photoelectric conversion element (photodiode) is obtained by forming a p-well 102 on an n-type substrate 101, then forming an n-layer 104 in the p-well 102, and forming a p-layer 105 with a highly doped surface on the n-layer 104. A floating diffusion region FD 107 is obtained by forming an n-layer 107 in the p-well 102. A gate region 103 of the transfer MOS transistor is formed above the region between the photodiode and the floating diffusion region 107 across an insulation layer, and, between the photodiode and the floating diffusion region FD 107 there is formed a bypass region continued from the n-layer of the photodiode.

A floating diffusion region FD 107 is connected to the gate of an amplifying MOS transistor of an output circuit, while the source of the amplifying MOS transistor is connected to the drain of a line selecting switch MOS transistor 111, of which source is connected to a current source I 112 constituting the load of the amplifying MOS transistor, whereby a source follower amplifying circuit is constituted.

The floating diffusion region FD 107 is also connected to the source of a resetting MOS transistor for setting the floating diffusion region FD, and the drain of the resetting MOS transistor is connected to a resetting power source 109.

In the following there will be explained the features of the present invention, together with the explanation of the charge reading operation. In response to the incident light, the electrons generated by photoelectric conversion are accumulated in the n-layer of the photodiode. In this state, the transfer MOS transistor is in the turned-off state. After the lapse of a predetermined accumulation time, a positive voltage is applied to the control electrode (gate region) of the transfer MOS transistor, thereby turning on the same and transferring the charge accumulated in the n-layer of the photodiode to the floating diffusion region. Before the transfer MOS transistor is turned on, the floating diffusion region is reset to a predetermined potential. When the accumulated charge, consisting of electrons, is transferred to the floating diffusion region, the potential is lowered by $Q_{sig}/C_{FD}$ from the reset potential, wherein $Q_{sig}$ is the transferred charge and $C_{FD}$ is the floating diffusion capacitance. If the charge accumulation layer of the photodiode is p-type, the voltage is elevated because the transferred charge consists of positive holes.

In such APS, it is possible to eliminate a major part of the reset noise of the floating diffusion region 107 by retaining the output signal $V_{r1}$ immediately after the resetting of the floating diffusion region 107 and calculating a difference $(V_{sig1}-V_{r1})$ wherein $V_{sig1}$ is the output signal in which $Q_{sig}/C_{FD}$ is overlapped with the reset signal. In particular, a higher noise elimination rate can be attained if the photodiode and the transfer MOS transistor satisfy the following condition. Stated differently, it is important that the signal charge accumulated in the n-layer of the photodiode is read out with a higher proportion.

More specifically, if the transfer MOS transistor is in a sufficiently turned-on state, the n-layer of the photodiode is given an inverse bias $VFD_{sig1}$ with respect to the ground potential of the p-well and the surfacially highly doped p-layer, wherein $VFD_{sig1}$ is the voltage of the floating diffusion region lowered by $Q_{sig}/C_{FD}$ from the reset voltage after the signal reading. In this state, a depletion layer extends from the p-well and the surfacially highly doped p-layer to the n-layer to deplete the entire n-layer of the photodiode, whereby the signal charge can be read to the floating diffusion region, almost without the remaining signal charge in the photodiode.

In the present embodiment, the photodiode is reset simultaneously with reading of the signal charge to the floating diffusion region. If no electrons remain in the n-layer of the photodiode after the signal reading, namely under the application of the inverse bias $VFD_{sig1}$ to the n-layer, the reset noise can be completely eliminated by calculating the difference between the output signal $V_{r1}$ immediately after the resetting and the output signal $V_{sig1}$ consisting of the reset signal superposed with $Q_{sig}/C_{FD}$, and there can thus be obtained an output $V_{sig1}-V_{r1}=Q_{sig}/C_{FD} \times A$ wherein A is the gain of the output circuit provided for each pixel.

To this output signal, there is added a noise $\Delta V_{n1}$ of the output circuit present for each pixel, and the final output from the integrated circuit formed as the region sensor further includes a noise $\Delta V_{n2}$ of the read-out system after the output circuit for each pixel.

In order to achieve the signal read-out as explained above, it is necessary to satisfy a relation $V_{dep} < V_{sigi}$ by applying an inverse bias to the n-layer of the photodiode, wherein $V_{dep}$ means a voltage at which the entire n-layer starts to be depleted. The depletion voltage of the photodiode generally means an inverse bias voltage realizing a condition:

Number of accumulated charges in the accumulation unit<net number of impurities.

Ideally, zero electrons remain in the n-layer of the photodiode after the signal read-out, but the actual level of signal read-out in fact depends on the designing of the system. Practically, the remaining signal level should be sufficiently smaller than the aforementioned noises $\Delta V_{n1}$, $\Delta V_{n2}$.

In order to realize the above-described operations, it is necessary to sufficiently turn on the transfer MOS transistor, and, for this purpose, the present invention utilizes the bypass region 106 between the buried photodiode and the transfer MOS transistor. The bypass region need not necessarily be in contact with the semiconductor surface, as shown in FIG. 4. Because, the bypass region is provided between the n-layer of the photodiode and the channel of the transfer MOS transistor, and, being a buried channel, it need not reach the surface. Also in case the channel is formed at the surface, the bypass region desirably reaches the surfacial channel, but, even if it does not reach the surfacial channel, there can be obtained a transfer MOS transistor with a sufficiently lower threshold voltage in comparison with that in the prior art, according to the aforementioned equations.

It is also effective that such bypass region is present under the gate of the transfer MOS transistor. With the application of a gate voltage, the potential under the gate is pushed up, and this effect is also applied to the bypass region, thereby further reducing the potential.

The present embodiment is featured by a configuration in which the transfer MOS transistor is connected to the floating diffusion region, and the present inventors have found that this configuration provides following effects:

1) The impurity concentration of the floating diffusion region can be selected high, so that the depletion layer formed between the well and the floating diffusion region can be effectively widened toward the p-well by the applied bias.

This arises from a fact that the voltage at the read-out (reset voltage) can be entered arbitrarily and directly;

2) In contrast to the small dynamic range, as in CCD, determined by the build-in potential of the impurity profile, there can be secured a wide dynamic range that can be controlled by an external voltage; and 3) An appropriate voltage at the signal read-out allows to suitably lower the potential barrier in the vicinity of the bypass region, thereby facilitating the signal read-out.

In the APS, since each pixel contains many transistors, the transistors themselves have to be made smaller for reducing the pixel size, thus inevitably resulting in an elevated impurity concentration of the wells of the photodiode and the transfer MOS transistor. Also the power supply voltage has to be lowered in reducing the size of the transistors. In order to reduce the depletion voltage $V_{dep}$ while maintaining a constant amount of charge processed in the photodiode, it is necessary to design the accumulation layer (n-layer in FIG. 3) of the photodiode with a higher impurity concentration and with a smaller thickness. Also it is necessary to reduce the width of the bypass region since it has to be depleted together with the n-layer of the photodiode.

The stricter precision required for the dimension of the n-layer of the photodiode and of the width of the bypass region, combined with the higher impurity concentration of the well, leads to an increased number of fluctuating parameters in the manufacturing process, thus leading to an even stricter precision required for the process and a lowered production yield. In particular, the width of the bypass region, being in the direction along the surface of the silicon substrate and generally less precise than the dimension in depth, constitutes a major factor in the deterioration of the production yield. The present invention increases the tolerance of the width of the bypass region by the above-mentioned effect (3), thereby improving the production yield.

The present invention also allows to increase the production yield, by improving the working precision of the width of the bypass region, through the manufacturing process to be explained in the following.

The bypass region in the conventional CCD has a significantly fluctuating width, depending on the aligning accuracy of the exposure apparatus, since it is formed by ion implantation of the n-layer of the photodiode prior to the formation of the control electrode of the transfer MOS transistor and ion implantation of the surfacially highly doped p-layer, utilizing the control electrode of the transfer MOS transistor as a mask.

On the other hand, the present embodiment can improve the dimensional precision, since the bypass region is formed by ion implantation, utilizing the control electrode of the transfer MOS transistor as a mask.

In the foregoing, the features of the present invention have been explained by a configuration of accumulating electrons, but the present invention is likewise applicable to a case of accumulating positive holes and is not limited by the type of the accumulated charge or of the transfer MOS transistor.

Now reference is made to FIGS. 6A to 6D for explaining a second embodiment of the present invention, relating to a method of forming the solid state image pickup device explained in the first embodiment. In the present embodiment, the photodiode and the peripheral configuration were formed in the following manner.

Figure 6A:
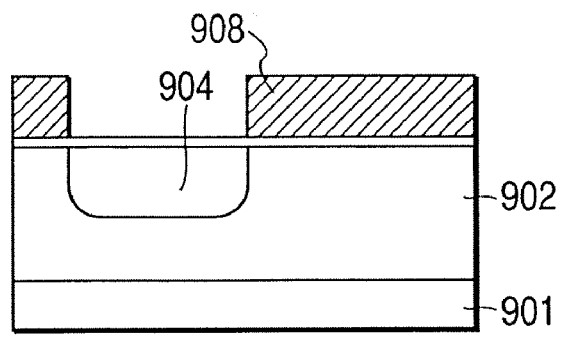
FIGS. 6A, 6B, 6C and 6D are cross-sectional views showing the manufacturing process of an embodiment 2 of the present invention.

Boron was introduced by ion implantation into an n-type substrate 901, which was heat treated to form a p-well 902 with a surfacial impurity concentration of ca. $2\times10^{16}$ cm$^{-3}$. Then a photoresist layer 908 was formed and an n-layer 904 of the photodiode was obtained (FIG. 6A).

Figure 6B:
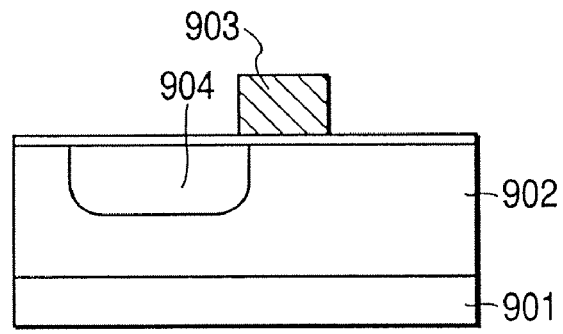

Then a gate oxide layer 910 of a thickness of 30 nm was formed on the entire substrate surface by thermal oxidation, and a control electrode 903 of the transfer MOS transistor was formed (FIG. 6B).

Figure 6C:
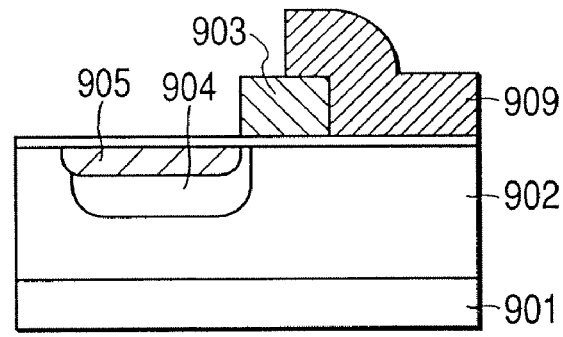

Then a photoresist layer 909 was formed on the photodiode and a part of the control electrode on the substrate surface, and, after a heat treatment of 950° C./20 min. in nitrogen atmosphere, a surfacially highly doped p-layer 905 was formed, utilizing the control electrode 903 as a mask (FIG. 6C).

Figure 6D:
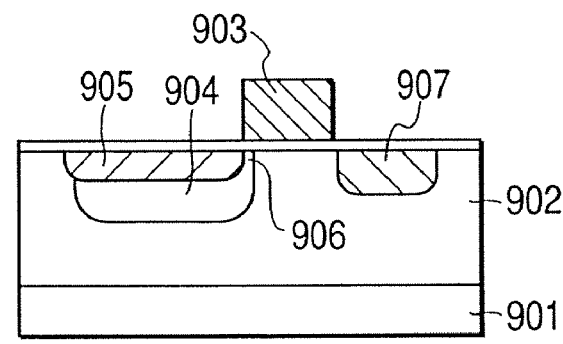

Then an As floating diffusion region 907 was formed according to the ordinary semiconductor process (FIG. 6D).

In this process, source and drain regions of the ordinary MOS transistor were formed.

Subsequently, a first interlayer insulation layer, a contact, a first metal wiring, a second interlayer insulation layer, a via connecting the first and second metal wirings, a second metal wiring and a passivation layer were formed one after another according to an ordinary semiconductor process.

As a result, there was formed a bypass region 906 of a width of about 100 nm. The threshold voltage of an ordinary MOS transistor having highly doped n-type diffusion layers on both sides thereof, the threshold voltage of a transfer MOS transistor having a source consisting of a buried n-layer without the bypass region and the threshold voltage with the bypass region (configuration of the present invention) were respectively evaluated as 0.7 V, 2.2 V and 0.7 V. These results indicate that the threshold voltage is lowered to the level of the ordinary MOS transistor. The reduction in the threshold voltage widens the dynamic range of the floating diffusion region by at least 1.5 V.

Now reference is made to FIGS. 7A to 7D for explaining a third embodiment of the present invention, relating to a method of forming the solid state image pickup device explained in the first embodiment. In the present embodiment, the photodiode and the peripheral configuration were formed in the following manner.

Figure 7A:
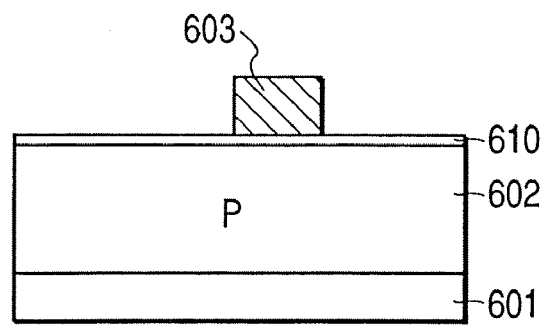
FIGS. 7A, 7B, 7C and 7D are cross-sectional views showing the manufacturing process of an embodiment 3, 4, 5 or 7 of the present invention.

Boron was introduced by ion implantation into an n-type substrate 601, which was heat treated to form a p-well 602 with a surfacial impurity concentration of ca. $4\times10^{16}$ cm$^{-3}$. After the formation of a gate oxide layer 610 of a thickness of 15 nm by thermal oxidation, polycrystalline silicon was deposited with a thickness of 400 nm, thereby forming a control electrode 603 of the transfer MOS transistor (FIG. 7A).

Then phosphor ions were implanted under 100 keV, utilizing a photoresist layer 608 and the control electrode 603.

Figure 7B:
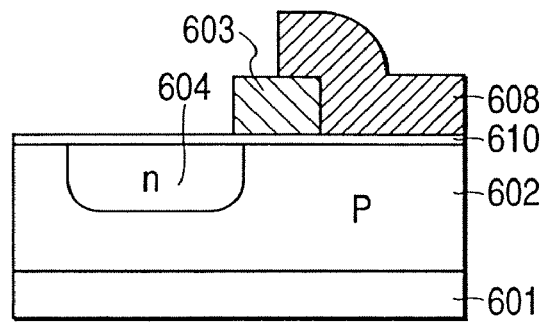
Figure 7C:
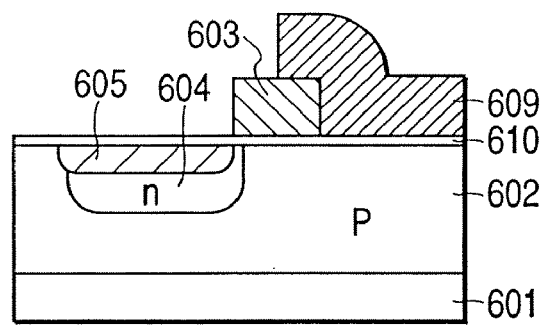

In this operation, with respect to the thickness of 400 nm of polycrystalline silicon, the projection stroke and standard deviation of phosphor were respectively 120 and 45 nm, whereby the polycrystalline silicon served satisfactorily as a mask (FIG. 7B).

Then, after the elimination of the photoresist layer 608, heat treatment was conducted for 20 minutes at 950° C. in nitrogen atmosphere to cause certain diffusion of phosphor. Then a photoresist layer 609 was formed again, and ion implantation of BF$_2$ was conducted at 35 keV, utilizing the photoresist layer 609 and the control electrode 603 as a mask (FIG. 7C). 605 indicates a surfacially highly doped p-layer.

Figure 7D:
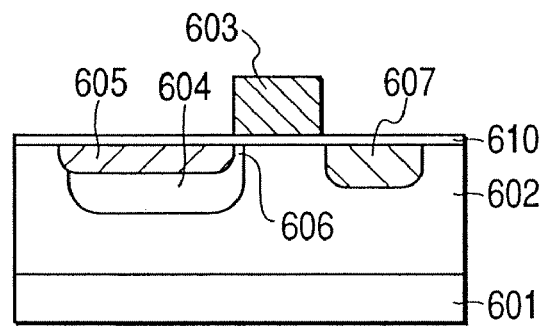
Figure 9A:
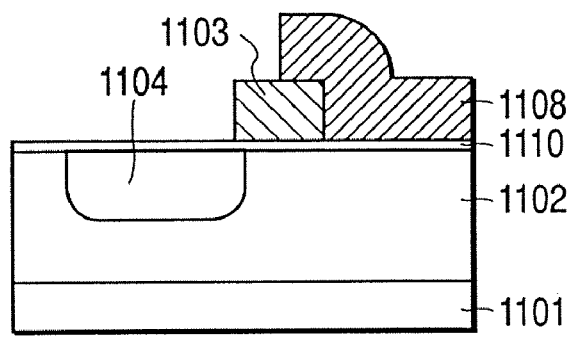
FIGS. 9A, 9B, 9C and 9D are cross-sectional views showing the manufacturing process of an embodiment 6 of the present invention.
Figure 9B:
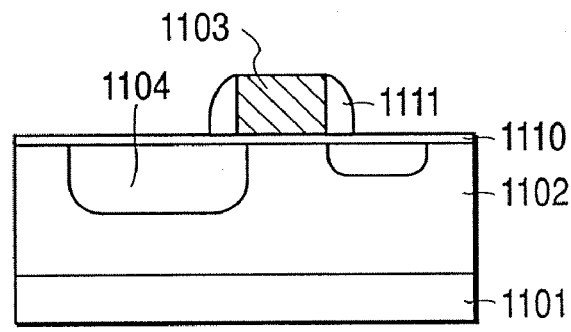
Figure 9C:
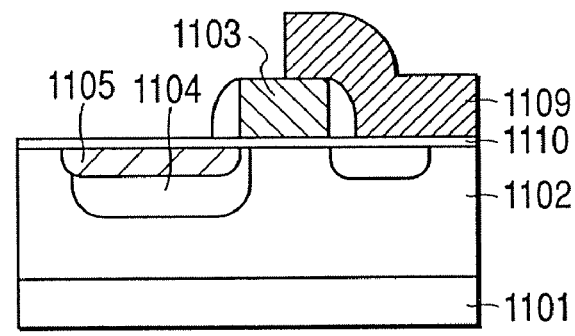
Figure 9D:
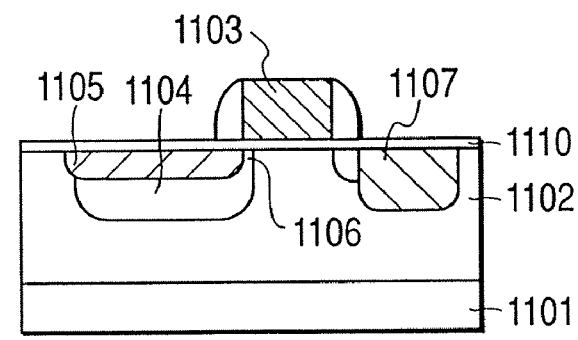

Then an As floating diffusion region 607 was formed by an ordinary semiconductor process (FIG. 7D). In this operation there were formed source and drain regions of the ordinary MOS transistor. In FIG. 7D, 606 indicates a bypass region.

Subsequently, a first interlayer insulation layer, a contact, a first metal wiring, a second interlayer insulation layer, a via connecting the first and second metal wirings, a second metal wiring and a passivation layer were formed one after another according to an ordinary semiconductor process.

As a result, there was formed a bypass region 606 of a width of about 100 nm. The threshold voltage of an ordinary MOS transistor having highly doped n-type diffusion layers on both sides, the threshold voltage of a transfer MOS transistor having a source consisting of a buried n-layer without the bypass region and the threshold voltage with the bypass region (configuration of the present invention) were respectively evaluated as 0.7 V, 3.5 V and 0.7 V. These results indicate that the threshold voltage is lowered to the level of the ordinary MOS transistor.

Figure 8:
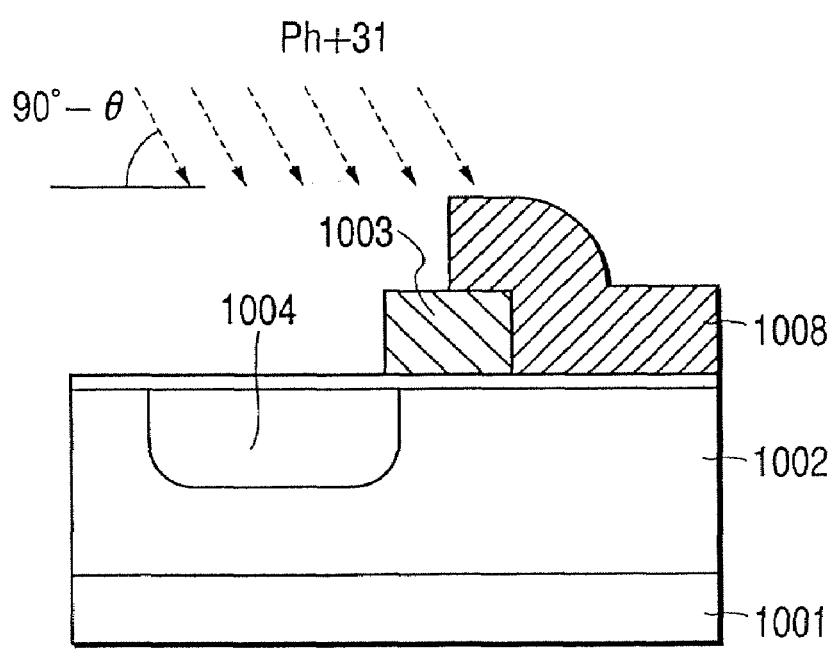
FIG. 8 is a cross-sectional view showing the manufacturing process of an embodiment 4, 5 or 7 of the present invention.

Now reference is made to FIGS. 7A, 7B and 8 for explaining a fourth embodiment of the present invention, relating to a method of forming the solid state image pickup device explained in the first embodiment. In the present embodiment, the photodiode and the peripheral configuration were formed in the following manner.

Boron was introduced by ion implantation into an n-type substrate 601, which was heat treated to form a p-well 602 with a surficial impurity concentration of ca. $4 \times 10^{16}$ cm$^{-3}$. After the formation of a gate oxide layer 610 of a thickness of 15 nm by thermal oxidation, polycrystalline silicon was deposited with a thickness of 400 nm, thereby forming a control electrode 603 of the transfer MOS transistor (FIG. 7A).

Then oblique ion implantation of phosphor was conducted under 100 keV, utilizing a photoresist layer 1008 and the control electrode 1003 as the mask. The ion implantation angle θ was selected as 20°. Because of such oblique ion implantation, the phosphor was present under the control electrode 1003 even immediately after the ion implantation. In this operation, with respect to the thickness of 400 nm of polycrystalline silicon, the projection stroke and standard deviation of phosphor were respectively 120 and 45 nm, whereby the polycrystalline silicon served satisfactorily as a mask (FIG. 8). In FIG. 8, there are also shown an n-type substrate 1001, a p-well 1002, and an n-layer 1004 of the photodiode.

Then, a photoresist layer 609 was formed again, and ion implantation of BF$_2$ was conducted at 35 keV, utilizing the photoresist layer 609 and the control electrode 603 as a mask (FIG. 7C). 605 indicates a surficially highly doped p-layer.

Then an As floating diffusion region 607 was formed by an ordinary semiconductor process (FIG. 7D).

In this operation there were formed source and drain regions of the ordinary MOS transistor.

Subsequently, a first interlayer insulation layer, a contact, a first metal wiring, a second interlayer insulation layer, a via connecting the first and second metal wirings, a second metal wiring and a passivation layer were formed one after another according to an ordinary semiconductor process.

As a result, there was formed a bypass region 606 of a width of about 100 nm. The threshold voltage of an ordinary MOS transistor having highly doped n-type diffusion layers on both sides, the threshold voltage of a transfer MOS transistor having a source consisting of a buried n-layer without the bypass region and the threshold voltage with the bypass region (configuration of the present invention) were respectively evaluated as 0.7 V, 3.5 V and 0.7 V. These results indicate that the threshold voltage is lowered to the level of the ordinary MOS transistor.

As the bypass region is formed by oblique phosphor ion implantation, the thermal treatment of 20 minutes at 950° C. employed in the example 2 for diffusing phosphor is omitted. As a result, the thermal treatment time in the semiconductor process could be shortened, so that the peripheral MOS transistors for signal processing could be reduced in size.

Now there will be explained a fifth embodiment of the present invention, relating to a method of forming the solid state image pickup device explained in the first embodiment. In the fifth embodiment, the phosphor ion implantation is divided into a first ion implantation for forming the bypass region and a second ion implantation for forming the n-layer of the photodiode.

The first ion implantation was conducted with an ion implantation angle of 45°, and under a voltage of 80 keV. In consideration of the profile of the p-layer having the highly doped surface, the ion implantation angle was selected larger than 20° in order to position the peak in the vicinity of the surface and to secure the bypass region.

The second ion implantation was conducted with an ion implantation angle of 7° and under a voltage of 90 keV, in order to control the depletion voltage of the p-layer of the photodiode.

In the present embodiment, by dividing the ion implantation for the bypass region and that for the n-layer of the photodiode, energy and dose of the ion implantation could be optimized for respective characteristics.

Now reference is made to FIGS. 9A to 9D for explaining a sixth embodiment of the present invention, relating to a method of forming the solid state image pickup device explained in the first embodiment. In the present embodiment, the photodiode and the peripheral configuration were formed in the following manner.

Boron was introduced by ion implantation into an n-type substrate 1101, which was heat treated to form a p-well 1102 with a surficial impurity concentration of ca. $2 \times 10^{16}$ cm$^{-3}$, thereby forming the n-layer of the photodiode, i.e., a first semiconductor region. After the formation of a gate oxide layer 1110 of a thickness of 30 nm by thermal oxidation, there was formed a control electrode 1103 of the transfer MOS transistor. Subsequently phosphor ions were implanted under a voltage of 100 keV, utilizing a photoresist layer 1108 and the control electrode 1103 as the mask (FIG. 9A). 1104 indicates the n-layer of the photodiode, i.e., a second semiconductor region.

After the formation of a low-doped n-layer for LDD in the floating diffusion region, a side spacer 1111 was formed with a width of 150 nm.

Then, a photoresist layer 1109 was formed, and ion implantation of BF$_2$ was conducted at 35 keV, utilizing the photoresist layer 1109, the control electrode 1103 and the spacer as a mask. The ion implantation angle was selected as 7° in order to control channeling (FIG. 9C). 1105 indicates a surficially highly doped p-layer, serving as a third semiconductor region.

Then an As floating diffusion region 1107, a fourth semiconductor region, was formed by an ordinary semiconductor process (FIG. 9D) and includes an adjacent sixth semiconductor region. A fifth semiconductor region 1106 is indicated by a bypass region.

In this operation there were formed source and drain regions of the ordinary MOS transistor.

Subsequently, a first interlayer insulation layer, a contact, a first metal wiring, a second interlayer insulation film, a via connecting the first and second metal wirings, a second metal wiring and a passivation layer were formed one after another according to an ordinary semiconductor process.

As a result, there was formed a bypass region 1106 of a width of about 150 nm. The threshold voltage of an ordinary MOS transistor having highly doped n-type diffusion layers on both sides, the threshold voltage of a transfer MOS transistor having a source consisting of a buried n-layer without the bypass region and the threshold voltage with the bypass region (configuration of the present invention) were respectively evaluated as 0.7 V, 3.5 V and 0.7 V. These results indicate that the threshold voltage is lowered to the level of the ordinary MOS transistor. The above-mentioned side spacer corresponds to the mask means.

The mask means may naturally be composed also by a silicide layer or the like instead of the side spacer.

Now reference is made to FIGS. 7A, 7B, 8 and 10 for explaining a seventh embodiment of the present invention, relating to a method of forming the solid state image pickup device explained in the first embodiment. In the present embodiment, the photodiode and the peripheral configuration were formed in the following manner.

Boron was introduced by ion implantation into an n-type substrate 601, which was heat treated to form a p-well 602 with a surfacial impurity concentration of ca. $4\times10^{16}$ cm$^{-3}$. After the formation of a gate oxide layer 610 of a thickness of 15 nm by thermal oxidation, polycrystalline silicon was deposited with a thickness of 400 nm, thereby forming a control electrode 603 of the transfer MOS transistor (FIG. 7A).

Then oblique ion implantation of phosphor was conducted under 100 keV, utilizing a photoresist layer 1008 and the control electrode 1003 as a mask. The ion implantation angle θ was selected as 10°. Because of such oblique ion implantation, the phosphor was present under the control electrode 1003 even immediately after the ion implantation. In this operation, with respect to the thickness of 400 nm of polycrystalline silicon, the projection stroke and standard deviation phosphor were respectively 120 and 45 nm, whereby the polycrystalline silicon served satisfactorily as a mask (FIG. 8).

Figure 10:
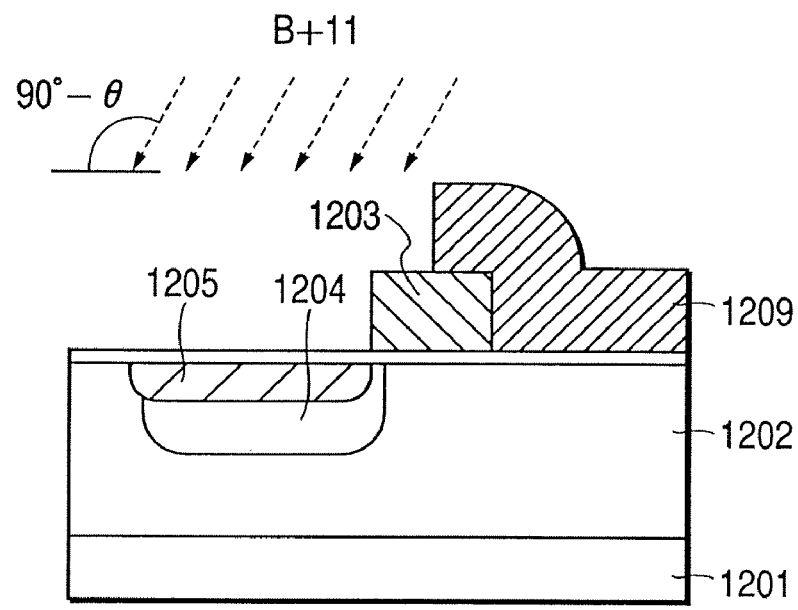
FIG. 10 is a cross-sectional view showing the manufacturing process of an embodiment 7 of the present invention.

Then, a photoresist layer 1209 was formed again, and ion implantation of $BF_2$ was conducted at 35 keV, utilizing the photoresist layer 1209 and the control electrode 1203 as a mask. In this operation, the ion implantation angle was selected as −15° (FIG. 10). In FIG. 10, there are shown an n-type substrate 1201, a p-well 1202 and an n-layer 1204 of the photodiode.

As a result, the control electrode 1203 formed a shadow and the surfacially highly doped p-layer 1205 could be separated from the control electrode 1203 by a distance 400×sin (15)=100 nm.

Then a floating diffusion region 607 including arsenic was formed by an ordinary semiconductor process (FIG. 7D). In this operation there were formed source and drain regions of the ordinary MOS transistor.

Subsequently, a first interlayer insulation layer, a contact, a first metal wiring, a second interlayer insulation layer, a via connecting the first and second metal wirings, a second metal wiring and a passivation layer were formed one after another according to an ordinary semiconductor process.

As a result, there was formed a bypass region 606 of a width of about 150 nm. The threshold voltage of an ordinary MOS transistor having highly doped n-type diffusion layers on both sides, the threshold voltage of a transfer MOS transistor having a source consisting of a buried n-layer without the bypass region and the threshold voltage with the bypass region (configuration of the present invention) were respectively evaluated as 0.7 V, 3.5 V and 0.7 V. These results indicate that the threshold voltage is lowered to the level of the ordinary MOS transistor.

As the bypass region is formed by oblique phosphor ion implantation, the thermal treatment of 20 minutes at 950° C. employed in the example 2 for diffusing phosphor was omitted. As a result, the thermal treatment time in the semiconductor process could be shortened, so that the peripheral MOS transistors for signal processing could be reduced in size.

In the following there will be explained, as a ninth embodiment of the present invention, the solid state image pickup device of the embodiment 1 or formed by methods explained in the second to eighth embodiments. The device is a region sensor having a pixel configuration of FIG. 11 employing the photodiode 705 and the transfer MOS transistor, and also having a read-out circuit shown in FIG. 12.

Figure 11:
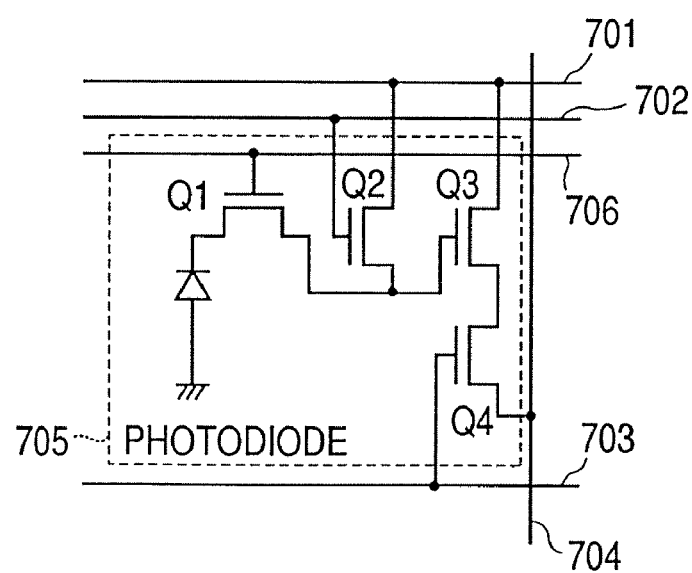
FIG. 11 is an equivalent circuit diagram of a pixel in the present invention.

Referring to FIG. 11, there are shown a transfer switch Q1 consisting of a transfer MOS transistor for a photodiode 705, a reset switch Q2 consisting of a reset MOS transistor for resetting the floating diffusion region, an input MOS transistor Q3 of a source follower amplifying circuit, consisting of a constant-current source 812, of which gate is connected to the floating diffusion region and which is connected as a load of the source side, and a selection switch Q4 for selecting the pixel to be read. There are also shown a power supply line 701, a reset switch line 702, a selection switch line 703, a signal output line 704 and a transfer switch line 706.

Figure 12:
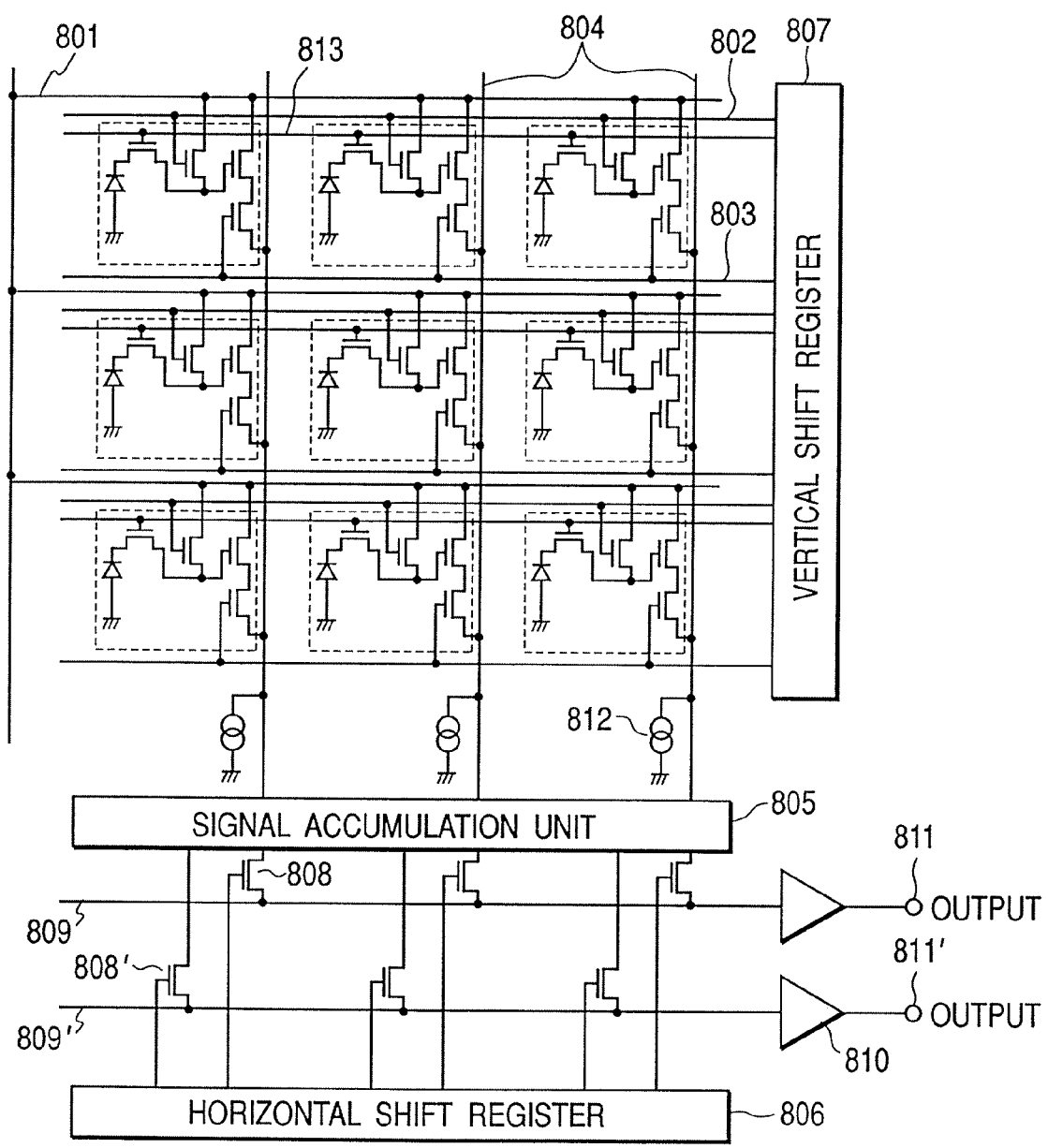
FIG. 12 is an equivalent circuit diagram of a region sensor of the present invention, including a read-out circuit.

FIG. 12 illustrates a solid state image pickup device, employing the pixel cells of the above-described photoelectric conversion elements, in a 3×3 matrix. There are shown a power supply line 801, a reset switch line 802, a selection switch line 806, a signal output line 804 and a transfer switch line 813.

In the following there will be explained basic functions of the circuits shown in FIGS. 11 and 12:

1) There are executed a resetting operation of entering a reset voltage to the input gate of the source follower circuit by the reset switch Q2 and a row selection by the selection switch Q4.

2) The gate of the floating diffusion region of the input node of the source follower circuit is maintained at the floating state to read the noise components including the resetting noise and the fixed pattern noise such as the functuation in the threshold voltage of the source follower MOS transistor, and the obtained noise information is stored in a signal accumulation unit 805.

3) Then the transfer switch Q1 is opened and closed to transfer the charge accumulated in the photodiode by the light signal, to the input node of the source follower circuit, and the sum of the aforementioned noise components and the light signal component is read and stored in the signal accumulation unit 805.

4) The transfer switches 808, 808' for the common signal lines 1, 2 are closed to transfer the noise component signal and the sum signal of the noise component and the light signal component respectively to the common signal lines 809, 809', and these signals are outputted as outputs 811, 811' respectively through output amplifiers 810.

Subsequently the light signal component is obtained by calculating the difference between the outputs 811, 811' to eliminate the resetting noise and the fixed pattern noise, thereby providing an image signal of a high S/N ratio.

The signal and the noise were evaluated by effecting the signal read-out through the above-described method. As a result, there could be obtained an S/N ratio as high as 75 to 85 dB in the dynamic range for each bit. Also the fluctuation in the S/N ratio in the foregoing embodiments was evaluated as follows:

fourth and fifth embodiments<third, sixth and seventh embodiments<<second embodiment.

This result indicates that the self-aligned formation utilizing the control electrode at a low temperature is more effective.

The foregoing embodiment allows to widen the dynamic range, by reducing the threshold value of the transfer MOS transistor, serving to transfer the photo-induced charge accumulated in the photodiode of the solid state image pickup device. In particular, since there is provided, between the photodiode and the control electrode of the transfer MOS transistor, the floating diffusion region of a bypass region capable of effectively transferring the charge accumulated by electrons or positive holes, the following advantages can be obtained:

1) It is rendered possible to select a high impurity concentration in the floating diffusion region, whereby, by application of a bias to the control electrode of the transfer switch, the depletion layer generated between the well and the floating diffusion region can be effectively spread toward the p-well. This results from a fact that the voltage at the signal read-out (resetting voltage) can be inputted arbitrarily and directly.

2) There can be secured a wide dynamic range controllable by the external voltage, in contrast to the narrow dynamic range determined by the build-in potential of the impurity profile in the conventional CCD sensor.

3) The potential barrier in the vicinity of the bypass region can be adequately lowered by selecting an appropriate voltage for the signal read-out, whereby the read-out of the photo-induced charge can be facilitated.

Many widely different embodiments of the present invention may be constructed without departing from the spirit and scope of the present invention. It should be understood that the present invention is not limited to the specific embodiments described in the specification, except as defined in the appended claims.

What is claimed is:

1. A MOS-type solid-state image pickup device comprising:
   a photoelectric conversion unit having a first semiconductor region of a first conductivity type, a second semiconductor region of a second conductivity type forming a pn-junction with the first semiconductor region, and a third semiconductor region of the first conductivity type disposed on the second semiconductor region;
   an amplifying MOS transistor, a gate electrode of the amplifying MOS transistor connected to a fourth semiconductor region of the second conductivity type;
   a transfer MOS transistor having the second semiconductor region, the fourth semiconductor region of the second conductivity type, and a gate electrode disposed on an insulating film on the first semiconductor region between the photoelectric conversion unit and the fourth semiconductor region to transfer a charge carrier from the second semiconductor region to the fourth semiconductor region, wherein the photoelectric conversion unit and the transfer MOS transistor are disposed on a substrate;
   a fifth semiconductor region of the second conductivity type arranged continuously to the second semiconductor region under the gate electrode; and
   a sixth semiconductor region of the second conductivity type having an impurity concentration lower than that of the fourth semiconductor region, and arranged at a side of the gate electrode in the fourth semiconductor region,
   wherein a drain of the transfer MOS transistor comprises the fourth and sixth semiconductor regions, and a bias is applied to the drain, and
   wherein the fifth semiconductor region is depleted during reading out the charge carrier from the second semiconductor region.

2. The MOS-type solid-state image pickup device according to claim 1, further comprising:
   a reset MOS transistor for resetting the fourth semiconductor region,
   wherein the reset MOS transistor supplies a bias to the drain of the resent MOS transistor.

3. The MOS-type solid-state image pickup device according to claim 1, wherein a sidewall is arranged on the sixth semiconductor region and side of the gate electrode of the transfer MOS transistor.

4. The MOS-type solid-state image pickup device according to claim 1, wherein the third semiconductor region does not extend to a bottom portion of the gate electrode of the transfer MOS transistor.

5. The MOS-type solid-state image pickup device according to claim 1, wherein the substrate is of the second conductivity type.

6. The MOS-type solid-state image pickup device according to claim 1,
   wherein the first semiconductor region is a well and disposed on the substrate, and
   wherein the fourth semiconductor region and the sixth semiconductor region are formed within the well.

* * * * *